United States Patent [19]

Hyatt

[11] Patent Number: 4,958,139

[45] Date of Patent: Sep. 18, 1990

[54] METHOD AND APPARATUS FOR AUTOMATICALLY CALIBRATING THE GAIN AND OFFSET OF A TIME-SHIFTED DIGITIZING CHANNEL

[75] Inventor: James R. Hyatt, Madison, Wis.

[73] Assignee: Nicolet Instrument Corporation, Madison, Wis.

[21] Appl. No.: 210,234

[22] Filed: Jun. 23, 1988

[51] Int. Cl.⁵ .............................................. H03M 7/00
[52] U.S. Cl. .................................... 340/122; 341/158; 341/139
[58] Field of Search ............... 341/120, 122, 141, 156, 341/158, 139

[56] References Cited

U.S. PATENT DOCUMENTS

| | | | |
|---|---|---|---|
| 4,342,983 | 8/1982 | Weigand et al. | 341/156 |
| 4,364,027 | 12/1982 | Murooka | 341/141 |
| 4,736,189 | 4/1988 | Katsumata et al. | 341/120 |
| 4,755,951 | 7/1988 | Hollister | 341/122 |
| 4,799,041 | 1/1989 | Layton | 341/158 |

OTHER PUBLICATIONS

National Semiconductor Linear Applications Databook, Publication 40004, Section AN-31, p. 93, 1986, National Semiconductor Corp., Santa Clara, CA.
Caldwell, J., "Digital Scope Invades Analog Domain", *Electronics*, Apr. 21, 1982, pp. 131–135.

*Primary Examiner*—William M. Shoop, Jr.
*Assistant Examiner*—Helen Kim
*Attorney, Agent, or Firm*—Foley & Lardner

[57] ABSTRACT

A circuit for automatically matching the gain and offset of a time-shifted digitizing channel in a data acquisition circuit which includes a reference digitizing channel, having a fixed voltage reference, and at least one time-shifted digitizing channel having components that are adjustable for gain and offset. Feedback is provided by examining the dynamic range and average value of a known input signal which is digitized, sent through the time-shifted digitizing channel and stored in memory. A microprocessor reads the stored data and, by separately varying the gain and offset parameters, computes optimal values for each parameter. Digital-to-analog converters (DAC's) allow the microprocessor to communicate with one fixed-gain variable-offset amplifier in the front end and with one fixed-gain variable-offset amplifier and one analog-to-digital converter (ADC) in each time-shifted digitizing channel. By controlling the offset of the amplifiers and the reference level of the ADC, precise matching of the gain and offset of the time-shifted digitizing channel with the gain and offset of the reference digitizing channel may be performed easily and inexpensively. The circuit may be extended to an arbitrary number of additional time-shifted digitizing channels and provides a comparatively simple, inexpensive way to automatically match the gain and offset of each time-shifted digitizing channel.

28 Claims, 5 Drawing Sheets

METHOD AND APPARATUS FOR AUTOMATICALLY CALIBRATING THE GAIN AND OFFSET OF A TIME-SHIFTED DIGITIZING CHANNEL

FIELD OF THE INVENTION

The invention relates to circuits for data acquisition systems which sample, digitize and store a signal. In particular, the invention relates to methods and means for calibrating the gain and offset parameters of one or more time-shifted digitizing channels in a data acquisition system, such as a digital oscilloscope, which employs multiple digitizing channels in a single data acquisition circuit.

BACKGROUND OF THE INVENTION

High speed collection, digitization and storage of analog signals, such as waveforms, in digital form has already eclipsed the speed of presently available analog-to-digital converters (ADC's). To achieve higher performance in a data acquisition circuit, one or more digitizing channels may be added in parallel so that successive data points of the sampled signal may be converted into digital form by different channels using different ADC's. The technique of "time-shifting" the added digitizing channels allows each channel to operate on data points from different moments in time, thus reducing the sampling rate of each channel and thereby reducing the bandwidth requirement on each individual ADC. In principle, it enables extremely fast analog-to-digital conversion, assuming, among other things, that enough parallel channels are available to achieve the desired speed. The technique is similar to that of interleaving the memory units in a high-performance computer.

However, there are problems associated with this type of data acquisition circuit. One of the more significant problems is that of correlating the resulting digitally encoded data. Unless the parallel digitizing channels have the same signal parameters, the data points encoded by different channels will have different gains and different zero frequency (dc) offsets. Of course, it is not generally possible to have identical circuits, because there will always be some manufacturing tolerances which permit differences between the components used in the various channels, so some form of compensation is needed to remove the unwanted parameter variation.

One way to compensate is to ignore the discrepancies in the data until all of the data points are collected and then perform some type of post-calibration, such as by reading back all of the data and correcting each data point for the particular gain and dc offset it received This may work in some cases, but it greatly complicates the process of correlating the data values from the various digitizing channels and reduces both the effectiveness and efficiency of the data collection. It could also result in some data values being lost if the input signal goes out of range of one of the digitizing channels. This effectively limits the useful dynamic range of the system to those signals which overlap all of the parallel channels. Unfortunately, as more parallel channels are added to achieve higher sampling speeds, it becomes more likely that some signals will not overlap all of the channels and that a reduction in dynamic range will occur.

Another way to compensate for discrepancies caused by differences between the digitizing channels is to perform manual calibration of the individual channels prior to the collection of data. Manual calibration of the circuit will work, but only if all of the operating parameters of all of the channels remain constant between calibration times. Unfortunately, the operating parameters may change as a result of changes in temperature, sampling rate, input sensitivity, etc. Since these changes are almost inevitable in a general purpose instrument, the assumption of constant parameters will probably be invalid. As a consequence, manual calibration offers little assurance of valid data. Manual calibration also requires the time and talents of someone to perform the calibration, which adds to maintenance costs and downtime.

A third way to compensate the channels is to provide some form of automatic calibration. One technique for doing this incorporates a wideband gain-programmable amplifier whose parameters are controlled by a feedback circuit. Such feedback circuits are generally straightforward to design but the programmable amplifiers are complex, costly devices which may be unsuitable for many applications. In particular, the cost and complexity may become prohibitive if many time-shifted digitizing channels are used, because each channel will require its own programmable amplifier.

SUMMARY OF THE INVENTION

In accordance with the present invention, a time-shifted digitizing channel in a data acquisition circuit is provided with a simplified, inexpensive method of and means for automatic calibration. Automatic calibration of the offset of the time-shifted channel is accomplished with a variable-offset amplifier whose offset is adjustable by a programmable controller. Automatic calibration of the gain is also accomplished with the programmable controller, by adjusting the reference input to the analog-to-digital converter in the time-shifted channel. By varying individual parameters one at a time and observing the results that appear in memory, the programmable controller automatically performs all of the calibrating adjustments. In particular, calibration occurs when the sums and differences of the data values produced by the time-shifted channel equal, or "match", the sums and differences of the data values produced by a reference channel, for a given input. Because the invention relies on algorithmic calibration from the programmable controller, rather than on expensive and complex feedback circuitry, the present invention can be implemented faster and easier in a wider variety of data acquisition circuits. An additional benefit accrues because matching the time-shifted channel(s) to the reference channel requires less precision than does absolute calibration of the time-shifted channel(s), thereby permitting the use of less expensive, lower tolerance components in the data acquisition circuit.

Additional objects, features, and advantages of the invention will be apparent from the following detailed description when taken in conjunction with the accompanying drawings.

DETAILED DESCRIPTION OF THE PREFERRED EMBODIMENT

Figure 1:
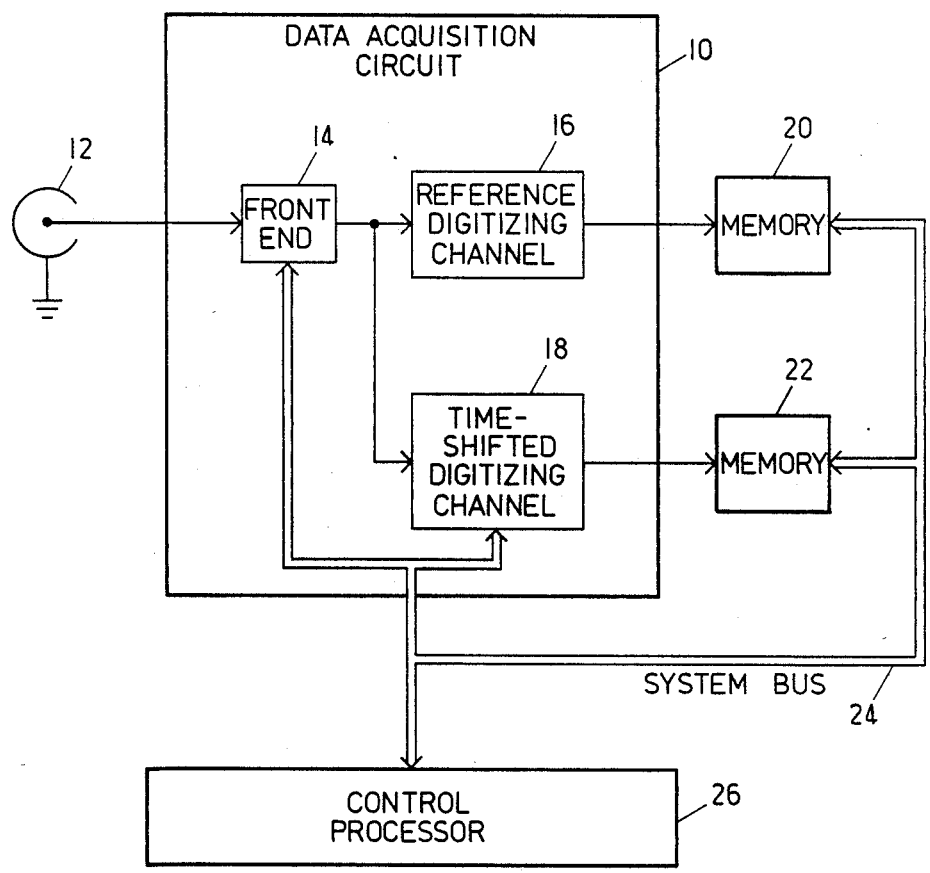
FIG. 1 is a block diagram of a data acquisition circuit in accordance with the present invention, showing the general arrangement of component including the reference and time-shifted channels.

With reference to FIG. 1, a data acquisition circuit is indicated by block 10. An input connector 12 is used to connect an analog input signal from a source, not shown, to the circuit 10. In the preferred embodiment of the present invention, the data acquisition circuit 10 is part of a waveform display device such as a digital oscilloscope, however it is also contemplated that the present invention might be used in a device which merely collects data for later analysis, such as waveform recorders or digitizers. A source of such data might be a high frequency electronic circuit or a transducer which produces a rapidly varying signal under dynamic load.

Within circuit 10, a front end 14 buffers the signal and scales it to the range of the rest of the circuit. After passing through the front end 14, the signal is sent to a reference digitizing channel 16 and to at least one time-shifted channel 18 which is connected in parallel with the reference channel 16. Each digitizing channel, 16 and 18, produces a digitized representation of the analog signal it receives and stores the digitized representation in a memory, such as a digital random-access memory (RAM), as indicated by blocks 20 and 22, respectively. For clarity of explanation, the memory for each digitizing channel will be shown as separate, it being understood that in an actual application the address space of the memories may be contiguous. Also connected to the memories 20 and 22 is a system bus 24, which includes both an address bus and a data bus as is known to the art, for providing communication between the memories 20 and 22 and a control processor 26. The control processor 26 is preferably a digital programmable controller, such as a microprocessor, of a type known to the art. The control processor 26 also communicates, via the system bus 24, with the front end 14 and with the time-shifted channel 18 for purposes which are explained fully below. In certain applications (not shown) the system bus 24 may also communicate with the reference channel 16, but in the preferred embodiment of the present invention this communication is not required.

Figure 2:
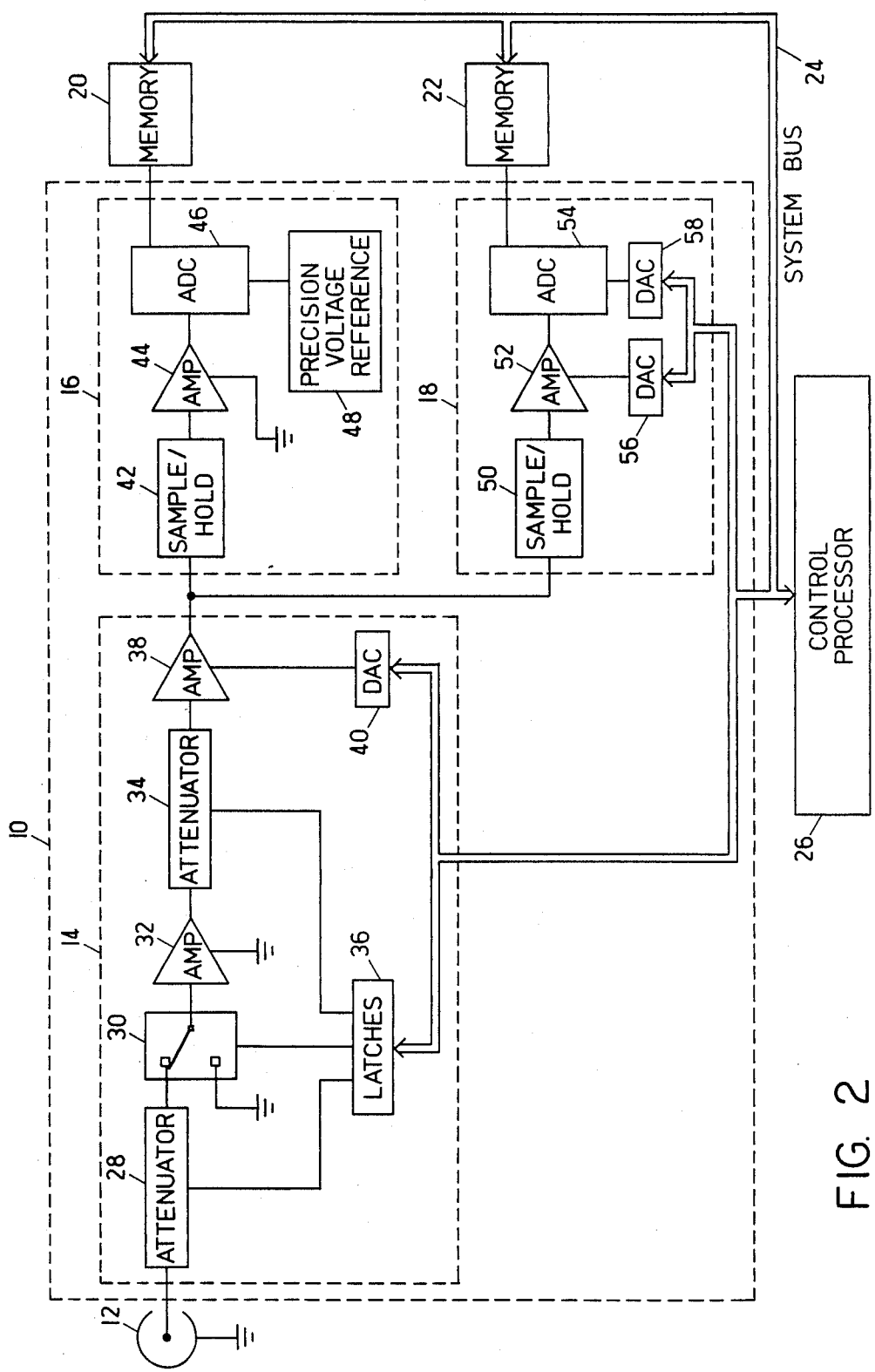
FIG. 2 is a detailed circuit diagram of the preferred embodiment of the present invention showing the use of a single time-shifted channel as illustrated by the block diagram of FIG. 1.

With reference to FIG. 2, the data acquisition circuit 10, the front end 14, the reference digitizing channel 16, and the time-shifted digitizing channel 18 are indicated by dotted lines which correspond to the blocks shown in FIG. 1. From the input connector 12, which in the preferred embodiment is a coax connector, the analog input signal is sent through a first programmable attenuator 28 which scales the signal into the range of operation of the remainder of the circuit 10. The signal then passes through a programmable source-selection switch 30 which acts as a two-to-one multiplexer; the switch being used to select between the input signal, in the position shown in the figure, and a known calibration signal, such as ground, in the alternate switch position. The signal selected by the switch 30 is sent through a zero-offset amplifier 32 to a second programmable attenuator 34. The control signal for the source-selection switch 30, and the attenuation factors for the two programmable attenuators 28 and 34, are provided through latched values from latches 36. Values are provided to the latches 36 from the control processor 26 via the system bus 24.

After passing through the second attenuator 34, the signal is sent through a second amplifier 38 which serves to buffer the input signal and to also provide a means for selecting the zero-frequency (dc) operating level of the front end 14. The offset of amplifier 38 is controlled by the control processor 26 via the system bus 24 and a digital-to-analog converter (DAC) 40. It will be appreciated by those in the art that this particular front end design is representative of a wide variety of front end designs which may be used in accordance with the present invention and that many variations and substitutions may be made in order to satisfy individual technical requirements or personal preferences.

Following amplification, buffering and appropriate offsetting in the front end 14, the signal is sent to the reference and time-shifted digitizing channels 16 and 18, respectively. The reference channel 16 includes a sample-and-hold circuit 42 which takes samples of the applied signal, a zero-offset amplifier 44 which buffers the sampled signal and provides necessary gain, and an analog-to-digital converter (ADC) 46 which uses a precision voltage reference 48 to determine digitizing levels for the signal. The digitized data from the ADC 46 is stored in memory unit 20, whose address locations are determined in a manner known to prior art, i.e. under the direction of the control processor 26 and possibly including direct memory access (DMA).

The time-shifted channel 18 is similar to the reference channel 16. Time-shifted channel 18 includes a sample-and-hold circuit 50, a variable-offset amplifier 52 and an ADC 54. Time-shifted channel 18 differs from the reference channel 16 in that the offset of amplifier 52 and the reference input of ADC 54 are controlled by the control processor 26 via the system bus 24. Adjustment of the offset of amplifier 52 and of the reference input of ADC 54 allows the offset and gain of the time-shifted channel 18 to be matched to the offset and gain of the reference channel 16. Adjusting the offset and gain parameters is enabled by digital-to-analog converters (DAC's) 56 and 58 which convert control signals from the control processor 26 into suitable analog inputs for the amplifier 52 and ADC 54, respectively. The digitized data from the ADC 54 is stored in memory unit 22, which is similar to memory unit 20 and is addressed in a similar way. Both memory units 20 and 22 include connections to the system bus 24 to allow the control processor 26 to access the stored data point values.

Figure 3A:
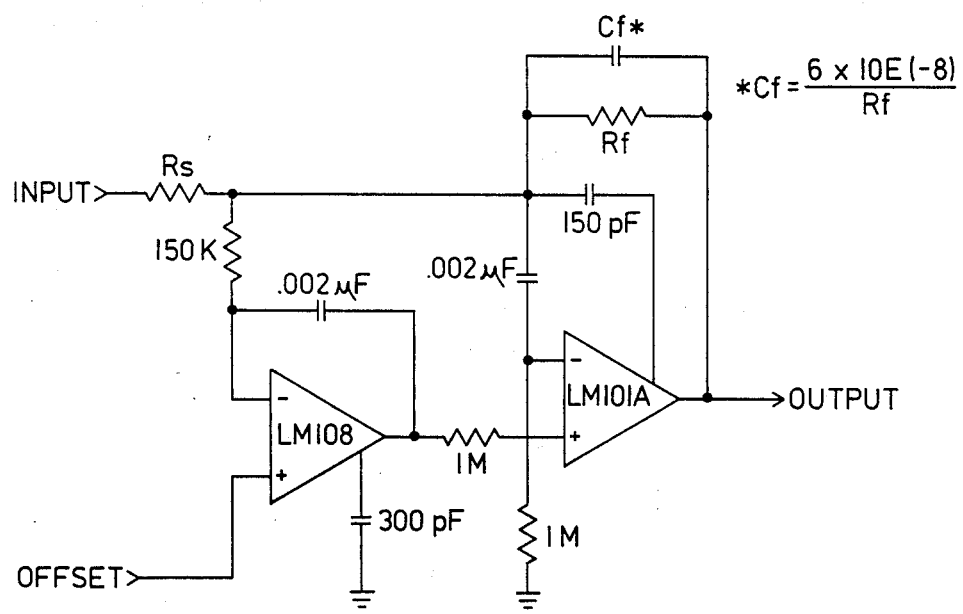
FIG. 3a is an example circuit schematic of a variable offset amplifier which may be used in accordance with the present invention.

In the preferred embodiment, ADC's 46 and 54 are 8-bit flash converters which operate at about 100 Megahertz, such as may be obtained from the Sony Corporation. Also in the preferred embodiment, amplifiers 44 and 52 are provided by compound wideband amplifiers employing a primary amplifier characterized as a wideband amplifier, having a bandwidth of about dc to -.15.0 MHz, and a secondary amplifier characterized as a low-frequency high-stability amplifier feedback-coupled to the primary amplifier to provide improved gain and offset stability within the frequency band of interest. Compound wideband amplifiers are described, for example, in the Linear Applications Databook from National Semiconductor Corporation, which is incorporated herein by reference. FIG. 3a is a reproduction of the circuit which appears under the heading "Fast Summing Amplifier with Low Input Current" on page 93 of Section AN-31 of the Databook.

With reference to FIG. 3a, LM101A is used as the primary amplifier to provide wideband amplification, while LM108 is used as the secondary amplifier to provide control and stability. To use the amplifier of FIG. 3a as a variable-offset amplifier, the non-inverting input of LM108 is controlled by DAC 56.

Figure 3B:
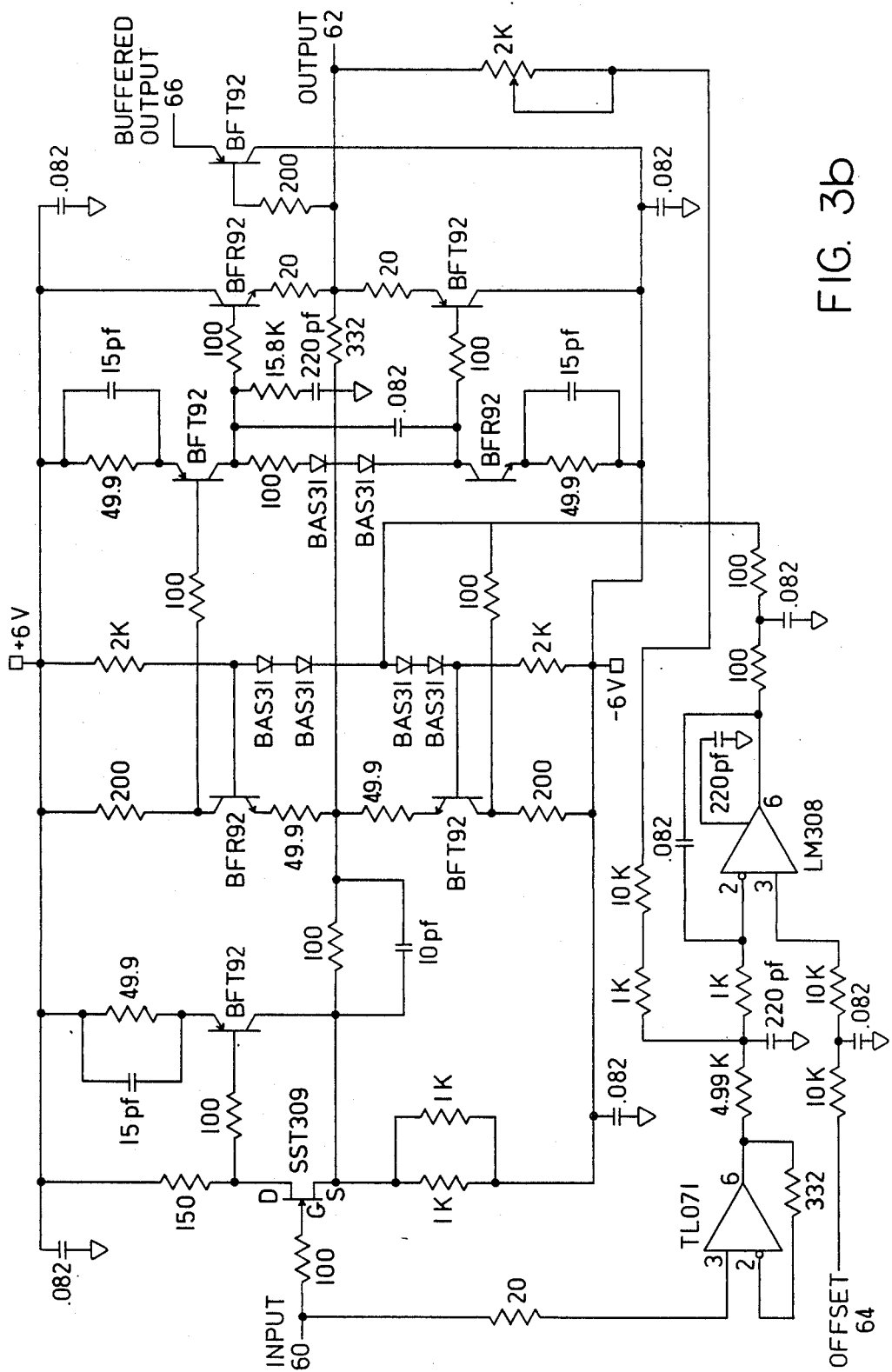
FIG. 3b an example circuit schematic of the variable offset amplifier used in accordance with the preferred embodiment of the present invention.

To attain lower cost performance in amplifiers 44 and 52, they may be built with other components. To this end, the preferred embodiment of the present invention employs the variable-offset amplifier circuit of FIG. 3b. As shown in FIG. 3b, most of the amplifier is built using discrete components. Component values are shown in the figure, with resistor values given in ohms and capacitor values given in microfarads unless otherwise specified (i.e. picofarads). Downward pointing arrows indicate ground. All NPN transistors are BFR92, all PNP transistors are BFT92, and the FET on the input line is an SST309. Offset control and stability are provided by the operational amplifiers TL071 and LM308. The input line 60, output line 62, and offset control line 64 are shown, as is a buffered output line 66 which is not used in the present implementation. It will be appreciated that many other amplifier designs may be suitable if a bandwidth other than 150 MHz is desired.

To match the gain and offset parameters of the time-shifted channel 18 to those of the reference channel 16, the control processor 26 first selects a grounded input with switch 30, via latch 36, and then centers the values of DAC's 56 and 58. While looking at the digital output of memories 20 and 22, the control processor 26 then finds the usable range of the DAC 40 by varying the value loaded into the DAC 40 until the usable upper and lower limits on these values is determined. The limits are reached when the data read from memories 20 or 22 reach maximum or minimum levels and stop changing. Then the upper and lower limits are widened so that the range of values in DAC 40 is purposely set to be larger than necessary. This is done to provide operation despite differences in component values. For example, if the tolerance of components is plus or minus about 25 percent, then the range of values is set to about 1.5 times full scale in order to guarantee that the signals will be within the range of operation of the circuit.

Once the range of values for DAC 40 is determined, values close to the upper and lower limits are alternately loaded into DAC 40 and an average is performed on the data from the memories 20 and 22 for each of the upper and lower values. Averaging removes the effects of noise and improves the resolution of the resulting computations. The average of the data values in memory 20 for the upper values in DAC 40 is denoted U20, the average of the data values in memory 20 for the lower values in DAC 40 is denoted L20; similarly the average data values in memory 22 for the upper and lower values in DAC 40 are denoted U22 and L22, respectively. These initial data values provide an indication of how far apart the gain and offset parameters are for the two digitizing channels, 16 and 18.

Once the values of U20, L20, U22 and L22 are determined, the control processor 26 begins the gain matching phase. This is accomplished by varying the value loaded into DAC 58 and recomputing U20, L20, U22 and L22 until the result:

$$(U20-L20)=(U22-L22)$$

is obtained. This signifies that the dynamic range, and thus the gain, of the paths through the digitizing channels 16 and 18 are equal. Of course, it is not essential that an exact equality be obtained. The values may be considered substantially equal if they are adequate to provide sufficient calibration accuracy for the tolerances of the device or the needs of the user. However, it should be appreciated that greater deviations from an exact equality will lead to greater deviations from an ideal calibration.

Once the gains are matched, the offsets are then matched. Control processor 26 varies the value loaded into DAC 56 and recomputes U20, L20, U22 and L22 until the result:

$$(U20+L20)/2=(U22+L22)/2$$

or the equivalent result:

$$(U20+L20)=(U22+L22)$$

is obtained. This signifies that the average value, and thus the offset, of the paths through the digitizing channels 16 and 18 are equal. This completes the matching sequence. As with the gain matching phase, substantial equality may be acceptable if the previously mentioned considerations are kept in mind. It will also be appreciated that the matching may easily be recomputed whenever a change occurs in the system, e.g. a change in the temperature, time base, input sensitivity, etc. After matching is completed, the control processor 26 sets the source-selection switch 30 so that the input signal again passes through the front end 14 and normal operation of the data acquisition circuit 10 resumes.

Figure 4:
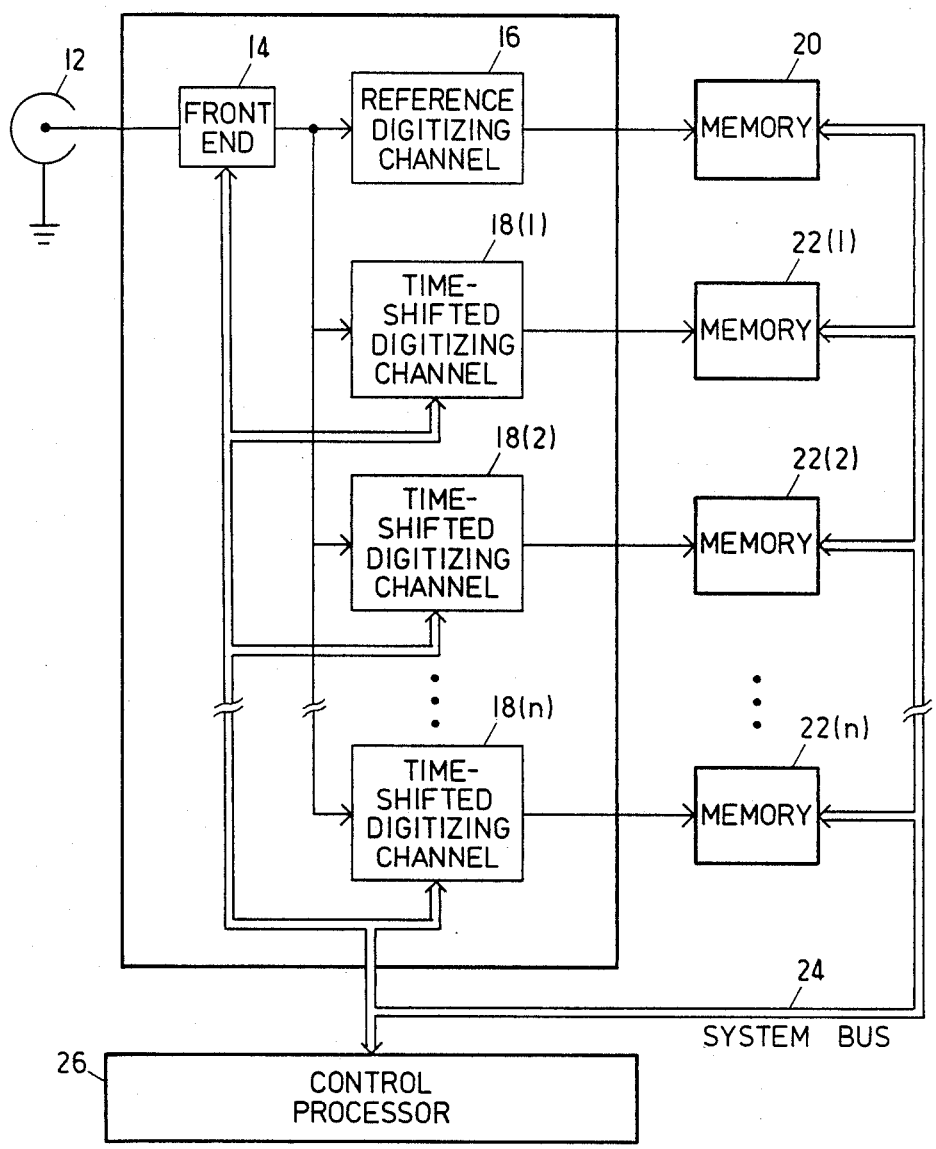
FIG. 4 is a block diagram of another embodiment of the present invention illustrating the manner in which the present invention may be extended to include a plurality of time-shifted channels.

Extension of this may readily be made to designs employing more than one time-shifted digitizing channel. In FIG. 4, a plurality of "n" time-shifted channels {18(1), 18(2), . . . ,18(n)} are added in parallel with the reference channel 16. Memories {22(1), 22(2), . . . ,22(n)} correspond to the "n" time-shifted channels. Automatic calibration of each of the time-shifted channels is accomplished in the same manner as above, with the differences and sums of the upper and lower data values being recomputed for each memory 22(i), i=1 to n, and the inputs to the gain and offset DAC's in each time-shifted channel 18(i), i =1 to n, being varied until the above-mentioned equalities are obtained for each time-shifted channel.

It is understood that the invention is not confined to the particular embodiments described herein as illustrative, but embraces such forms thereof as come within the scope of the following claims.

I claim:

1. A time-shifted digitizing channel, disposed in parallel with a reference digitizing channel within a data acquisition circuit of the type which digitizes and stores values of a signal in a first memory via the reference digitizing channel and in a second memory via the time-shifted digitizing channel, which comprises:

(a) sample-and-hold circuit for receiving the signal;

(b) a variable-offset amplifier disposed to receive the signal from the sample-and-hold circuit, the amplifier having an offset input controlled by an offset controller; and (c) an analog-to-digital converter connected between the variable-offset amplifier and the second memory, the converter having a reference input controlled by a gain controller.

2. The device of claim 1, wherein the gain controller includes a gain calibration means, responsive to the difference between the average upper and lower data values stored in the second memory, for varying said reference input of the analog-to-digital converter until the difference between the average upper and lower data values stored in the first memory is substantially equal to the difference between the average upper and lower data values stored in the second memory.

3. The device of claim I, wherein the offset controller includes an offset calibration means, responsive to the sum of the average upper and lower data values stored in the second memory, for varying said offset input of the amplifier until the sum of the average upper and lower data values stored in the first memory is substantially equal to the sum of the average upper and lower data values stored in the second memory.

4. The device of claim 1, wherein:
  (a) the gain controller includes a gain calibration means, responsive to the difference between the average upper and lower data values stored in the second memory, for varying said reference input of the analog-to-digital converter until the difference between the average upper and lower data values stored in the first memory is substantially equal to the difference between the average upper and lower data values stored in the second memory; and
  (b) the offset controller includes an offset calibration means, responsive to the sum of the average upper and lower data values stored in the second memory, for varying said offset input of the amplifier until the sum of the average upper and lower data values stored in the first memory is substantially equal to the sum of the average upper and lower data values stored in the second memory.

5. The device of claim 2, wherein the gain calibration means includes:
  (a) a first digital-to-analog converter, connected to said reference input; and
  (b) a digital programmable controller, connected to the first digital-to-analog converter, the digital programmable controller including program instructions for computing said differences between said average upper and lower data values stored in the first and second memories and for varying a digital signal sent to the first digital-to-analog converter.

6. The device of claim 3, wherein the offset calibration means includes:
  (a) a second digital-to-analog converter, connected to said offset input; and
  (b) a digital programmable controller, connected to the second digital-to-analog converter, the digital programmable controller including program instructions for computing said sums of said average upper and lower data values stored in the first and second memories and for varying a digital signal sent to the second digitial-to-analog converter.

7. A data acquisition device which may be automatically calibrated to provide matched gain and offset parameters for a time-shifted digitizing channel with respect to a reference digitizing channel, comprising:
  (a) a front end which includes:
    i. electrical means for passing an input signal, and
    ii. signal switch means for selectively outputting either a calibration signal or the input signal;
  (b) a reference digitizing channel which includes precision electrical means for sampling and digitizing the signal from the front end;
  (c) a first memory for storing the data values from the reference digitizing channel;
  (d) a time-shifted digitizing channel which includes:
    i. a sample-and-hold circuit disposed to receive the signal from the front end,
    ii. a variable-offset amplifier, having an offset input controlled by an offset controller, disposed to receive the signal from the sample-and-hold circuit, and
    iii. an analog-to-digital converter, having a reference input controlled by a gain controller, disposed to receive the signal from the variable-offset amplifier;
  (e) a second memory for storing the data values from the time-shifted digitizing channel;
  (f) gain calibration means, responsive to the difference between the average upper and lower data values in the second memory, for varying the gain controller until said difference is substantially equal to the difference between the average upper and lower data values in the first memory; and
  (g) offset calibration means, responsive to the sum of the average upper and lower data values in the second memory, for varying the offset controller until said sum is substantially equal to the sum of the average upper and lower data values in the first memory.

8. The device of claim 7, wherein the gain calibration means comprises a digital programmable controller.

9. The device of claim 8, wherein the gain controller includes an analog-to-digital converter.

10. The device of claim 7, wherein the offset calibration means comprises a digital programmable controller.

11. The device of claim 10, wherein the offset controller includes an analog-to-digital converter.

12. The device of claim 7, 9, or 11, wherein the calibration signal from the front end includes a grounded signal.

13. The device of claim 7, 9, or 11, wherein the first and second memories comprise random-access memories.

14. The device of claim 7, wherein the gain calibration means and the offset calibration means are provided by a single digital programmable controller.

15. A data acquisition device which may be automatically calibrated to provide matched gain and offset parameters for a time-shifted digitizing channel with respect to a reference digitizing channel, comprising:
  (a) a front end which includes:
    i. electrical means for passing an input signal, and
    ii. signal switch means for selectively outputting either a calibration signal or the input signal;
  (b) a reference digitizing channel which includes precision electrical means for sampling and digitizing the signal from the front end;
  (c) a first memory for storing the data values from the reference digitizing channel;
  (d) a plurality of time-shifted digitizing channels which each include:
    i. a sample-and-hold circuit disposed to receive the signal from the front end, ii. a variable-offset amplifier, having an offset input controlled by an offset controller, disposed to receive the signal from the sample-and-hold circuit, and iii. an analog-to-digital converter, having a reference input controlled by a gain controller, disposed to receive the signal from the variable-offset amplifier;

(e) a plurality of second memories for storing the data values from each of the plurality of time-shifted digitizing channels;

(f) gain calibration means, responsive to the difference between the average upper and lower data values in each of the second memories, for varying each of the gain controllers until each said difference is substantially equal to the difference between the average upper and lower data values in the first memory; and (g) offset calibration means, responsive to the sum of the average upper and lower data values in each of the second memories, for varying each of the offset controllers until each said sum is substantially equal to the sum of the average upper and lower data values in the first memory.

16. The device of claim 15, wherein the gain calibration means and the offset calibration means are provided by a single digital programmable controller.

17. The device of claim 7 or 15, wherein the reference digitizing channel includes:

i. a sample-and-hold circuit disposed to receive the signal from the front end, ii. a zero-offset amplifier disposed to receive the signal from the sample-and-hold circuit, and iii. an analog-to-digital converter, having a reference input controlled by a precision voltage reference, disposed to receive the signal from the zero-offset amplifier.

18. The device of claim 7 or 15, wherein the front end electrical means includes:

i. a buffering means for buffering the input signal, and ii. a gain adjustment means for adjusting the gain of the input signal.

19. A method for matching the gain of a time-shifted digitizing channel to the gain of a reference digitizing channel, comprising the steps of:

(a) applying a known calibration signal to both digitizing channels;

(b) calculating the average upper and lower data values produced by the reference digitizing channel;

(c) calculating the average upper and lower data values produced by the time-shifted digitizing channel; and (d) varying the gain of the time-shifted digitizing channel until the difference between the average upper and lower data values produced by the time-shifted digitizing channel is substantially equal to the difference between the average upper and lower data values produced by the reference digitizing channel.

20. A method for matching the offset of a time-shifted digitizing channel to the offset of a reference digitizing channel, comprising the steps of:

(a) a applying a known calibration signal to both digitizing channels;

(b) calculating the average upper and lower data values produced by the reference digitizing channel;

(c) calculating the average upper and lower data values produced by the time-shifted digitizing channel; and (d) varying the offset of the time-shifted digitizing channel until the sum of the average upper and lower data values produced by the time-shifted digitizing channel is substantially equal to the sum of the average upper and lower data values produced by the reference digitizing channel.

21. A method for matching the gain and offset of a time-shifted digitizing channel to the gain and offset of a reference digitizing channel, comprising the steps of:

(a) applying a known calibration signal to both digitizing channels;

(b) calculating the average upper and lower data values produced by the reference digitizing channel;

(c) calculating the average upper and lower data values produced by the time-shifted digitizing channel;

(d) varying the gain of the time-shifted digitizing channel until the difference between the average upper and lower data values produced by the time-shifted digitizing channel is substantially equal to the difference between the average upper and lower data values produced by the reference digitizing channel; and (e) varying the offset of the time-shifted digitizing channel until the sum of the average upper and lower data values produced by the time-shifted digitizing channel is substantially equal to the sum of the average upper and lower data values produced by the reference digitizing channel.

22. The method of claim 19 or 21, wherein said step of varying the gain of the time-shifted digitizing channel includes the step of varying the reference input of an analog-to-digital converter.

23. The method of claim 19 or 21, wherein said step of varying the gain of the time-shifted digitizing channel includes the step of varying the gain of each of a plurality of time-shifted digitizing channels until the difference between the average upper and lower data values produced by each time-shifted digitizing channel is substantially equal to the difference between the average upper and lower data values produced by the reference digitizing channel.

24. The method of claim 23, wherein said step of varying the gain of each of a plurality of time-shifted digitizing channels includes the step of varying the reference input of an analog-to-digital converter for each time-shifted digitizing channel.

25. The method of claim 20 or 21, wherein said step of varying the offset of the time-shifted digitizing channel includes the step of varying the offset input of a variable-offset amplifier.

26. The method of claim 20 or 21, wherein said step of varying the offset of the time-shifted digitizing channel includes the step of varying the offset of each of a plurality of time-shifted digitizing channels until the sum of the average upper and lower data values produced by each time-shifted digitizing channel is substantially equal to the sum of the average upper and lower data values produced by the reference digitizing channel.

27. The method of claim 26, wherein said step of varying the offset of each of a plurality of time-shifted digitizing channels includes the step of varying the offset input of a variable-offset amplifier for each time-shifted digitizing channel.

28. A time-shifted digitizing channel, disposed in parallel with a reference digitizing channel within a data acquisition circuit of the type which digitizes and stores values of a signal in a first memory via the reference digitizing channel and in a second memory via the time-shifted digitizing channel, which comprises:
(a) a sampling circuit means for producing a sequence of analog samples of the signal;
(b) a variable-offset amplifier disposed to receive the signal from the sampling circuit means, the amplifier having an offset input controlled by an offset controller; and
(c) an analog-to-digital converter connected between the variable-offset amplifier and the second memory, the converter having a reference input controlled by a gain controller.

* * * * *